(12) United States Patent
Mahalingam

(10) Patent No.: US 8,666,444 B2
(45) Date of Patent: Mar. 4, 2014

(54) MULTIPLE-MODE INPUT KEYPAD

(76) Inventor: Padmanabhan Mahalingam, Madras, IN (US)

( * ) Notice: Subject to any disclaimer, the term of this patent is extended or adjusted under 35 U.S.C. 154(b) by 189 days.

(21) Appl. No.: 12/950,575

(22) Filed: Nov. 19, 2010

(65) Prior Publication Data

US 2012/0129568 A1  May 24, 2012

(51) Int. Cl.
*H04M 1/00* (2006.01)
(52) U.S. Cl.
USPC ............ 455/550.1; 455/90.1; 455/556.1; 400/109; 379/433.07
(58) Field of Classification Search
None
See application file for complete search history.

(56) References Cited

U.S. PATENT DOCUMENTS

| | | | |
|---|---|---|---|
| 7,952,495 B1* | 5/2011 | McDonald | 341/22 |
| 2003/0063739 A1* | 4/2003 | Otsuka | 379/433.07 |
| 2008/0258941 A1* | 10/2008 | Oh | 341/22 |
| 2009/0134576 A1* | 5/2009 | Hacker | 273/272 |
| 2011/0020771 A1* | 1/2011 | Rea et al. | 434/114 |

* cited by examiner

*Primary Examiner* — German J Viana Di Prisco
(74) *Attorney, Agent, or Firm* — Donald R. Boys; Central Coast Patent Agency, Inc.

(57) ABSTRACT

A communication device has an input keypad having physical input keys arranged in a matrix of rows and columns, a mode input mechanism to select a specific mode, and software or firmware responsive to mode selected through the mode input mechanism, comprising a specific mapping of input keys and process of input to output characters, depending on mode selected. In any specific mode, inputs by the physical input keys are mapped to output characters according to the specific mapping and process associated with the selected mode.

12 Claims, 5 Drawing Sheets

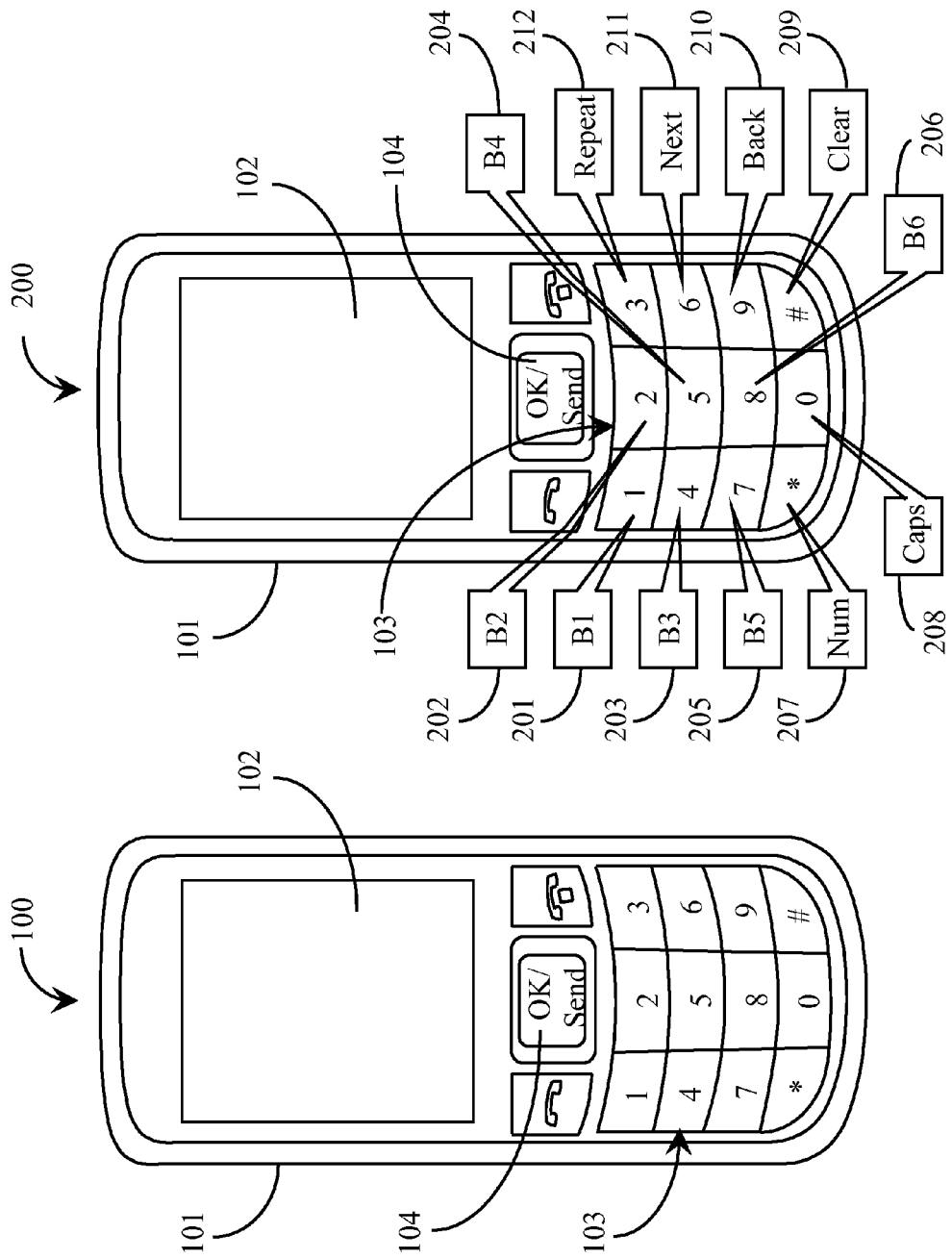

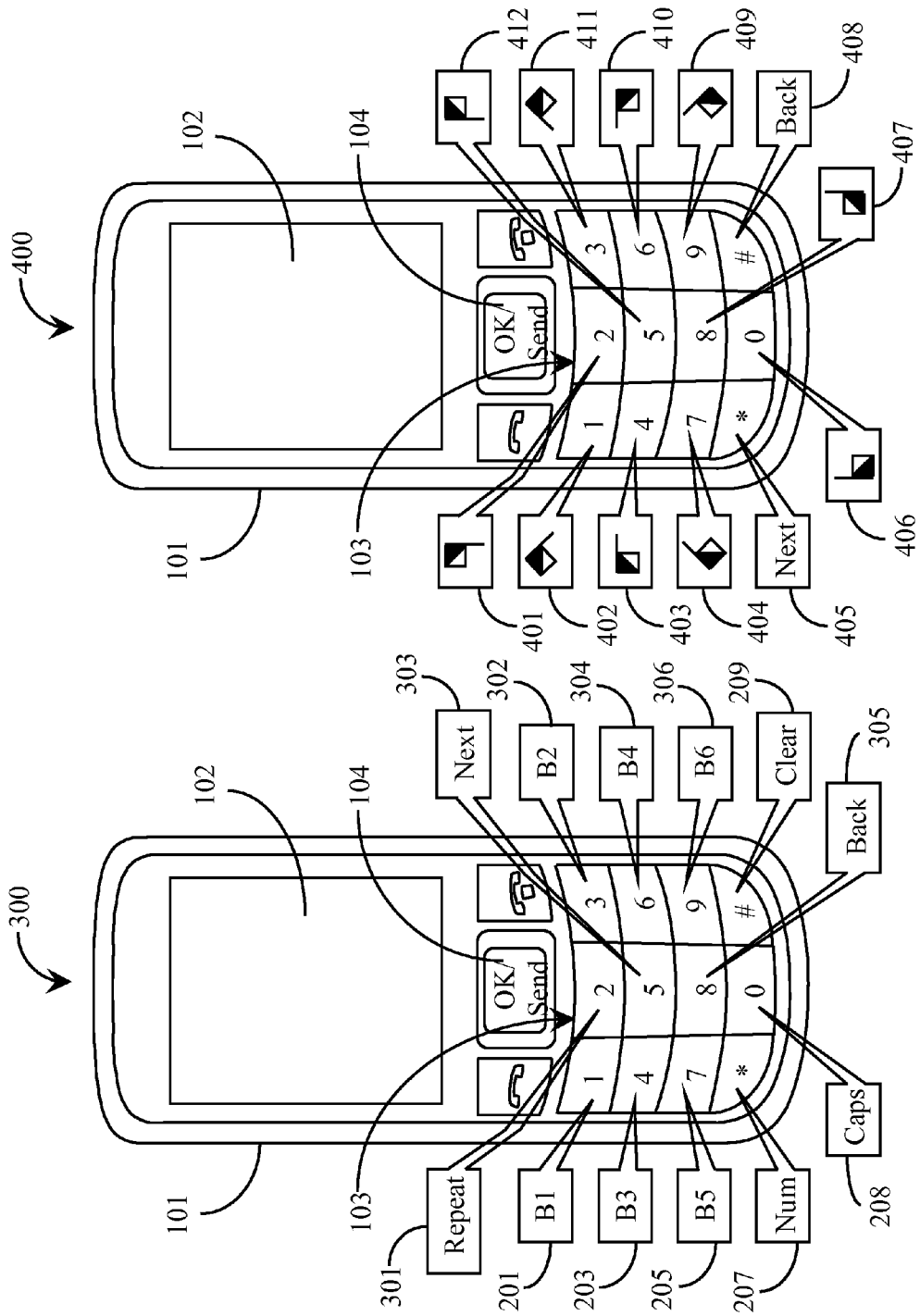

MULTIPLE-MODE INPUT KEYPAD

BACKGROUND OF THE INVENTION

1. Field of the Invention

The present invention is in the field of electronic communication devices and pertains particularly to methods and apparatus for entering alpha-numeric characters, common to text-based communication, through a physical keypad, or a keyboard present on a device.

2. Description of Related Art

The consumer market currently bears proof of proliferation of products for communicating our thoughts and actions. Cellular telephones, computers and voice recognition systems are just a few of the many ways our society has developed systems and devices for communication. But regrettably, the greatest numbers of visually impaired people have not been afforded the same opportunity in the current communications market.

Persons that are blind or severely visually impaired require special input devices to interact with electronic communications and computing devices. Although there are a variety of devices available to the visually impaired, many of them are cost prohibitive or require a steep learning curve for a user to operate. While technology has been beneficial in devices for the blind, more innovation is required in order to extend current market product capabilities to those having visual impairments or sight-related disabilities. Those who are blind often resort to some other structured form of data input, such as speech-to-text systems, Braille keyboards, or similar type instruments.

Many devices are known and commercially available for general alphanumeric input, such as physical computer keyboards and keypads or cell phone keypads, for just a few examples. Unfortunately, the keyboard and keypad interfaces for these products have not been readily adapted for visually impaired people. There is a definite need for enhancements to available input devices such as these, making them more useful for the visually impaired.

BRIEF SUMMARY OF THE INVENTION

In one embodiment of the present invention a communication device is provided, comprising an input keypad having physical input keys arranged in a matrix of rows and columns, a mode input mechanism to select a specific mode, and software or firmware responsive to mode selected through the mode input mechanism, comprising a specific mapping of input keys and process of input to output characters, depending on mode selected. In this device any specific mode, inputs by the physical input keys are mapped to output characters according to the specific mapping and process associated with the selected mode.

Also in one embodiment physical input keys display alphanumeric characters, and the characters displayed comprise a default mode for character output. Still in one embodiment the physical input keys display alphanumeric characters, the software (SW) or firmware providing a first mode mapping input keys and process to a six-point Braille matrix and process, having six keys dedicated as primary input keys. The primary input keys may be mapped as two columns of three keys each, or as two columns of four keys each, and the columns may be the left and right-most columns to facilitate two-handed operation.

In alternative embodiments the input may system semaphore code or Morse code.

In another aspect of the invention a method for alternative character input with a keypad is provided, comprising the steps of (a) providing software or firmware to a device using the keypad with alphanumeric characters as a default input mode, the software or firmware enabling at least one alternative input mode mapping keys and process of key selection to output characters other than the default characters; (b) providing a mode selection input mechanism by which a user is enabled to select a specific alternative input mode; and (c) selecting an alternative mode and using the keypad to produce output characters according to the alternative input mode.

BRIEF DESCRIPTION OF THE SEVERAL VIEWS OF THE DRAWINGS

FIG. 1 is a plan view of a cellular phone device (prior art), whereby the interface is programmed for typical cellular phone input.

FIG. 2 is a plan view of a cellular phone of FIG. 1, whereby the keypad interface is programmed for Braille input according to one embodiment of the present invention.

FIG. 3 is a plan view of a cellular phone of FIG. 2, whereby the Braille input keys are programmed for two-handed operation.

FIG. 4 is a plan view of cellular phone in FIG. 1 with input keys programmed for Semaphore operation according to another embodiment of the present invention.

DETAILED DESCRIPTION OF THE INVENTION

Figure 6:
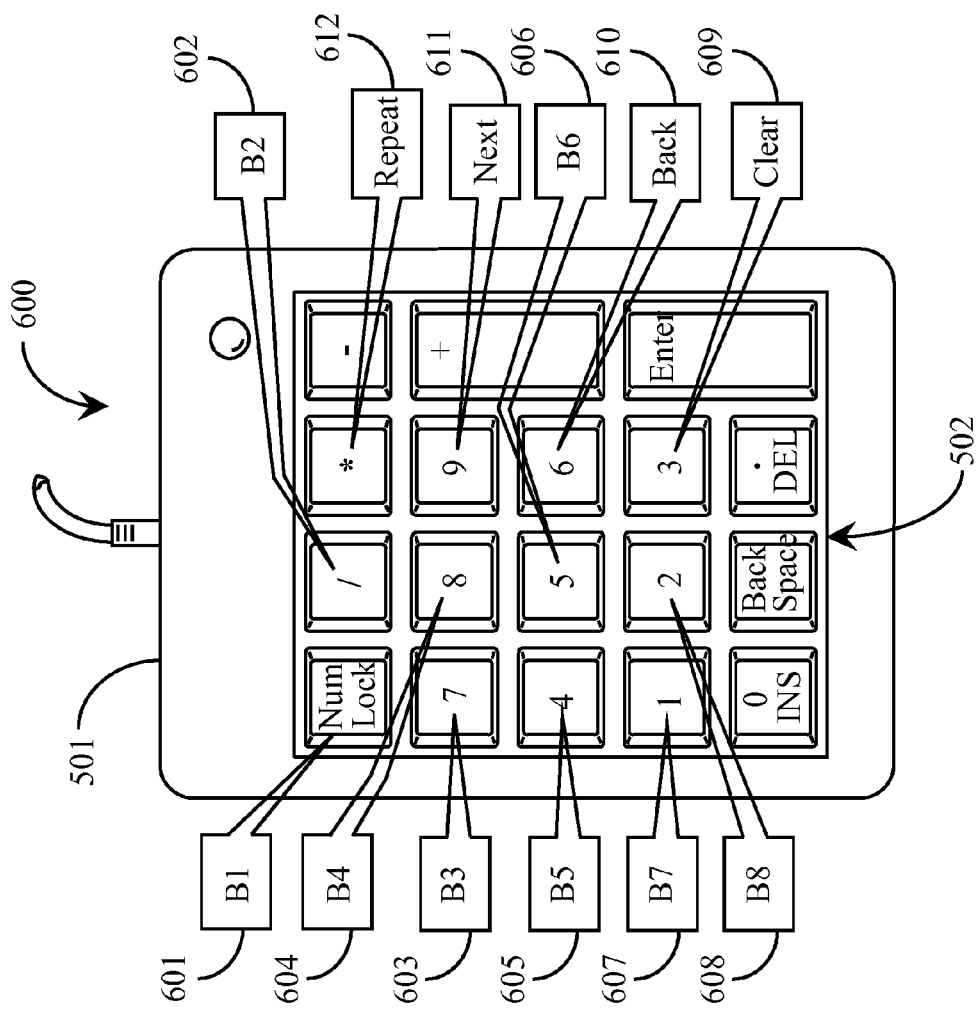
FIG. 6 is a plan view of computer keypad device of FIG. 5, whereby the interface is programmed for Braille input according to another embodiment of the present invention.

FIG. 1 is a plan view of a cellular phone device 100 of prior art and may be readily found in today's communications-rich environment. The cellular phone of this example comprises a housing 101 which encloses internal electronics that enable its use. The phone device also may have an LED screen 102 where characters and images may be displayed. An alphanumeric keypad matrix 103 is provided and is primary to interfacing with the device for common telephone operations. For example, by depressing a key, or combination of keys in the matrix, a string of characters may be interpreted and transmitted to make a call to any like telecommunication device. This example is the most basic form of operation for this type of device. Other forms of communication for the cellular device may include SMS texting, MMS transmission and possibly web-browsing capability. The device of FIG. 1 comprises other useful elements for operation, such as an OK/Send key 104 to aid in forms of keypad input.

As noted previously, a person who is visually impaired, or blind, will find the use of keypads for current products difficult, if not impossible, especially for normal texting operations. Most likely, memorizing the cellular keypad layout for numerical inputs will not be an issue for the visually impaired. In contrast though, using the keypad for alphabetic input proves to be more challenging. The inventor of the present invention proposes a unique solution to this problem.

By re-programming a plurality of keys on the keypad for Braille input, visually impaired people will be more capable and comfortable using the device for SMS and other communication protocols. Taking advantage of their knowledge of Braille, low-cost products and available service providers present in the market, re-programming provides added benefit for a keypad equipped device.

Referring to FIG. 2, cellular phone 200 comprises keypad matrix 103 of FIG. 1 and is re-programmed for using six-point Braille (also referred to as Grade 1 Braille) characters or cells, the form of which is typically well-known to the visually impaired. By using a software/firmware that is loaded to device memory (further described later in this disclosure), keystrokes performed to various keys of the cellular keypad, are re-associated to six-point Braille, translated to alphanumeric ASCII characters and then compiled to form basic words, phrases and sentences for text-based communication.

For example, illustrated in FIG. 2, the primary keys for keying the Braille characters are represented by two adjacent columns of keys with three subsequent adjacent rows of keys which are associated to standard Braille positions. The Braille dot-position keypad elements, beginning with the upper left-most location on the keypad, may be as follows: B1 element 201, B2 element 202, B3 element 203, B4 element 204, B5 element 205 and B6 element 206. A visually impaired person may depress any combination of these six keys to form 6-point Braille characters. For example, by depressing B1, B2, B3 and B5 an ASCII character P or numeral 16 is represented.

Other keys of the keypad may be associated to actions that aid in forming full words or phrases useful for communicating a SMS text message, for example. In particular, an asterisk key of the keypad may be associated to Num Lock 207 or numeral key to Caps Lock element 208. According to one embodiment of the present invention, other key associations may include the number three key associated to a repeat previous character (element 212), the number six key associated to a next character in sequence (element 211), the nine key to a backspace previous character (element 210) and the pound symbol character associated to a clear (element 209) previously input characters function.

FIG. 3 is a plan view of cellular phone 300 illustrating other possible key pattern associations. Previously described in FIG. 2 of the present invention, the Braille dot-position vertical columns are directly adjacent to each other. Other embodiments may allow for a re-association of the right-hand column, of these two columns, for the dot pattern and the outermost right-hand column of the keypad. In doing so, key associations that were previously shown as part of the 6-point Braille keys B2 element 202, B4 element 204 and B6 element 206 are now associated to elements Repeat 301, Next 303 and Back 305. In like manner, elements that were previously associated with keys Repeat, Next and Back are re-associated to Braille keys B2 element 302, B4 element 304 and B6 element 306. In doing so, a user may input Braille keystrokes with the thumbs of both hands, increasing ease of use and keystroke speed.

FIG. 4 is a plan view of cellular phone 400 illustrating another possible key pattern association of the present invention. In this example, keys of the keypad are programmed to respond to input from a user representing flag signals of Semaphore Code.

Marine Semaphore communication requires two flags to be used, simultaneously with out-stretched arms in a pattern which resembles a clock face divided into eight positions: up, down, out, high, low, for each of the left and right hands (LH and RH). The formation of separate known flag combinations indicate different alpha-numeric characters, performed in sequence, spelling out words and phrases. Persons skilled in interpreting the flag signals may easily communicate messages back and forth with others having like skill. The inventor has determined the ease for which a keypad or keyboard may be re-programmed to represent the standard characters of Semaphore Code. The common keys of keypad matrix 103 of cellular phone 400 are 1, 2, 3, 4, 5, 6, 7, 8, 9, 0, asterisk and pound symbol and may be re-associated to certain keys representing flags held by the RH and LH of a signaler.

The RH flag key representations associated to keys of keypad 103 comprises RH-up 401, RH-high 402, RH-out 403, RH-low 404 and RH-down 406. Furthermore, flag representations associated to keypad keys for the LH of a signaler comprises LH-up 412, LH-high 411, LH-out 410, LH-low 409 and LH-down 407. Other keys of the keypad may be associated to functions that aid a user in forming sentence structures such as, but not limited to, next 405 and back 408 keys, for a couple of examples.

Referring to FIG. 4, by depressing in sequence keys 402, 410 then 405 (indicating next character); 411, 406 then 405; then keys 409 and 403 of keypad 103 the alphabetic characters y, e and s are spelled forming the word yes, described here as just one example for word and phrase formations. It should be noted, other key associations are possible for any remaining keys of a keypad or keyboard that may aid a user in much the same way, such as stop, annul or error keys (not shown).

Figure 5:
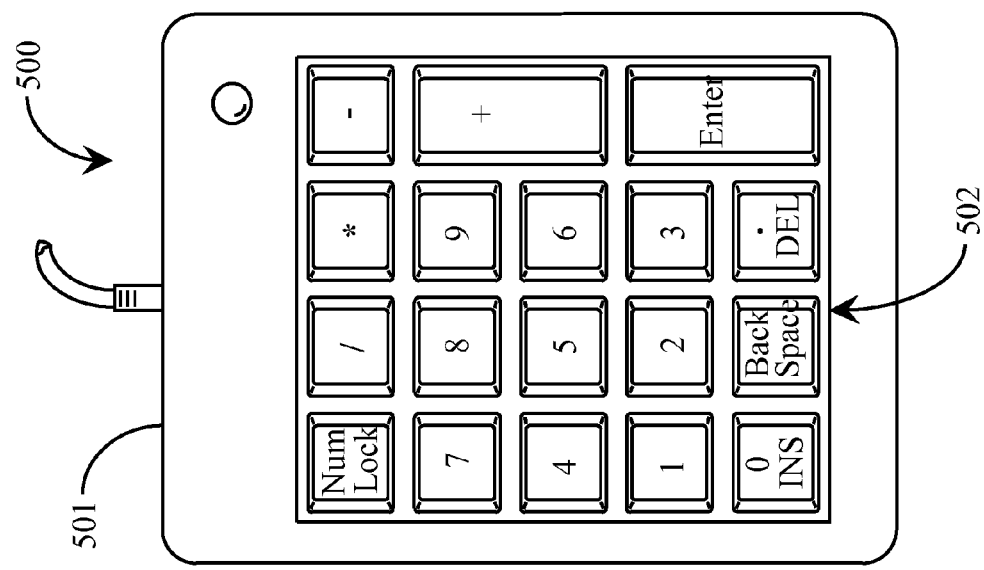
FIG. 5 is a plan view of a computer keypad device (prior art), whereby the interface is programmed for typical computer input.

FIG. 5 is a plan view of a computer keypad device (prior art) 500 illustrating a standard input device for entering ASCII text based characters into a computerized appliance. The device of FIG. 5 may also be adapted, using software/firmware (further described later in this disclosure), for use by the blind according to another embodiment of the present invention. Computer keypad devices of this form are found, virtually, throughout all home, office and work environments. The keypad device illustrated in FIG. 5 is a standalone version used to key numerical characters into a computer-based software, but may be a similar keypad device coupled or incorporated into a larger form of computer keyboard (not shown), which are well known in the art.

Computer keypad device 500 comprises an electronics housing 501 provided for containing internal electrical components, which allow for the devices operation. Also provided, and paramount to its function, is a computer keypad matrix 502 which comprises a plurality of keys, conveniently arranged to a standard layout, allowing a user to enter numerical characters.

Referring to FIG. 6, the computer keypad 600 is re-programmed for using eight-point Braille (also referred to as Grade 2 Braille) characters or cells, the form of which is also well-known to most visually impaired or blind people. In 8-point Braille there is a similar layout of the dot formation as found in 6-point Braille, described previously, with an additional row of two character locations. These locations may be used to form additional dot combinations for furthering the variety of character or contraction symbol possibilities for a blind user, and is widely used among the visually impaired. Using a software/firmware (further described later in this disclosure) which is loaded to device memory, or possibly a separate driver utility (not shown) in the computer, keystrokes performed to various keys of the keypad are re-associated to eight-point Braille, translated to alphanumeric ASCII characters and then compiled to form basic words, phrases and sentences of text-based communication.

For example, illustrated in FIG. 6, the primary keys for keystrokes representing 8-point Braille characters are represented by two adjacent columns of keys with four subsequent adjacent rows of keys, which are associated this standard of Braille communication. The Braille dot-position keypad elements, beginning with the upper leftmost location on the keypad, may be as follows: B1 element 601, B2 element 602, B3 element 603, B4 element 604, B5 element 605, B6 element 606, B7 element 607 and B8 element 608. A visually impaired person may depress any combination of these eight keys to form Braille characters or common contractions.

Other keys of keypad matrix 502 may be associated to functions that aid in forming full words, or contractions useful for communicating a SMS text message, for example. In particular, an asterisk key of keypad matrix 502 may be associated to a repeat function 612 or number key 9 to be associated to a next function 611. According to other embodiments of the present invention, key associations may also include the number six key associated to a back function 610 eliminating the previous character, or the number three key associated to a Clear function 609 which performs much like a calculator clear function may operate. These and other key associations for the available keys of a keypad are just a few of the associations which may be made by the skilled artisan, while developing the Braille keypad device.

Figure 7:
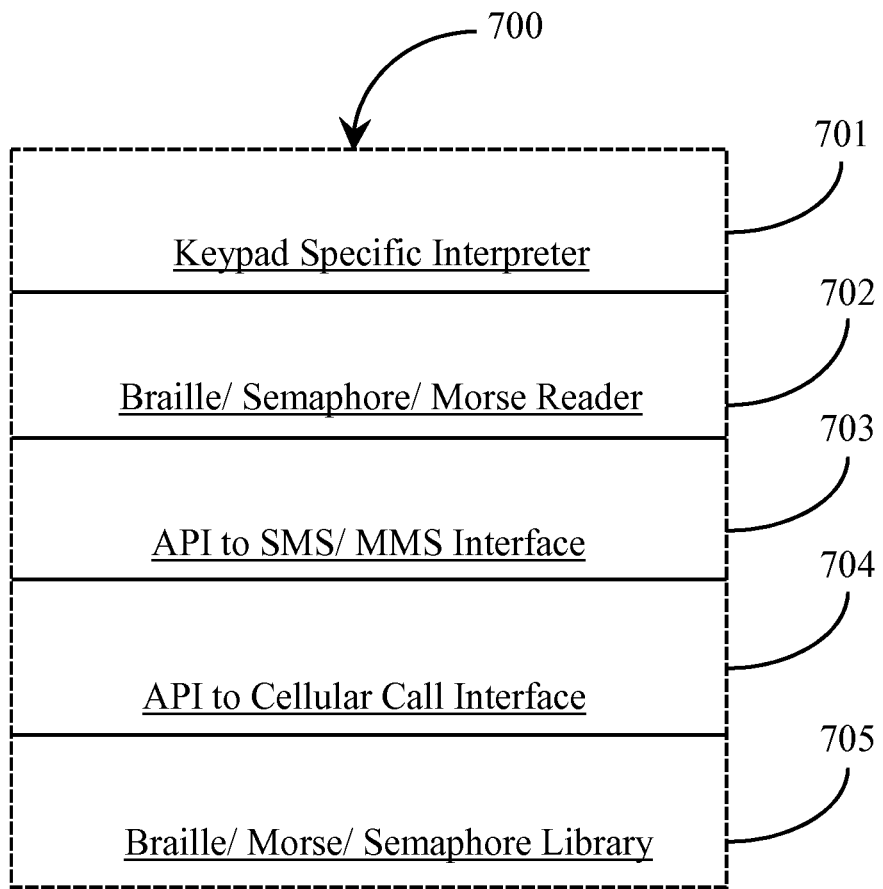
FIG. 7 is a block diagram of a software/firmware which interprets input keys to be translated into SMS, Semaphore or Morse code.

FIG. 7 is a block diagram illustrating a software/firmware application 700 supporting a keypad interface of the present invention. SW 700 is adapted as an executable program that can be downloaded to a communications or computing appliance such as illustrated in FIG. 1 and FIG. 5, for example. SW 700 includes a key specific interpreter 701. Interpreter 701 recognizes the interface on the device including individual keys representing dot patterns of the Grade 1 or 2 Braille code. It may also interpret keys specifically associated to flag representations of Marine semaphore code. Whenever a keypad key is depressed, the SW detects it, determines its associated symbol or function and records it.

It will be apparent to the skilled artisan that other forms of coded communication may be accomplished with the devices of FIGS. 1 and 5. For example, by associating any two keys of cellular phone keypad 103 or computer keypad 502 (illustrated in FIGS. 2, 3, 4 and 6), one key to represent a short tone signal and any other key to represent a long tone signal, a visually impaired person will have the ability to communicate in Morse code (not illustrated), a code language well known in the art of electronics communication.

Interpreter 701 may also comprise specific instruction sets that allow a user the ability to change the keypad language mode. For instance, the OK/Send key 104 (illustrated in FIG. 2), when depressed in sequence, a user may toggle between Grade 1 Braille, Grade 2 Braille, Semaphore Code or Morse code language modes within the device. Other embodiments may use a combination of predetermined keystrokes to change modes. For instance, by depressing the asterisk key once and then the pound key of keypad 103 the mode for Grade 1 Braille might be activated. In like manner, by depressing the asterisk key once and then the pound key twice, the mode for Semaphore code might be activated.

SW 700 includes a character reader 702 that may be adapted to read Braille, Marine semaphore and/or Morse code characters. The reader parses in real time as a user is operating through the keypad and inputting characters through any one of the included or supported interfaces. It is noted that only one interface of the types discussed need be provided to practice the present invention.

SW 700 includes an application program interface (API) to a text messaging interface loaded on the communications or computing appliance, in one embodiment, a cellular phone. The text messaging interface may be an instant message interface, an SMS or MMS interface. In one embodiment API 703 is compatible with a variety of messaging programs and services and may be operated in conjunction with more than one optional messaging interface. A default messaging interface may be assigned so that when in operation, character input may be applied to a message template generated by the associated messaging service. In practice, characters input through the keypad are converted to human readable language and inserted into the body of an SMS that may then be sent to an intended recipient over a communications network.

SW 700 comprises an API to a cellular call interface. In this case characters input through the keypad are interpreted by the SW and converted to standard language text before being parsed by a text to voice recognition module 705 and synthesized as a voice message that may be sent to a voice mail inbox, a voice enabled end device like a cellular telephone, or an end computing appliance having voice messaging capabilities.

Braille/Semaphore/Morse reader 702 uses a character library 705 that includes all of the relevant characters depending on the type or types of interfaces provided for cellular phone 200, 300 and 400. The library is used to recognize Braille characters, for example, before they are rendered as normal text for inserting into a message for send. Library 705 may be installed on an internal or external memory device that is accessible to the host appliance.

In one embodiment of the present invention, the instructions for messaging including adding one or more contacts to the recipient list of the message are input from the same interface as the message. SW 700 has access to all of the listed contacts through the API and may, in one embodiment, be adapted to prompt a visually impaired user to enter characters for specific messaging fields such as recipient, subject line, Carbon Copy (CC), Blind Carbon Copy (BCC), etc. The present invention may be used to input text for messaging or for inserting into documents, etc.

Figure 8:
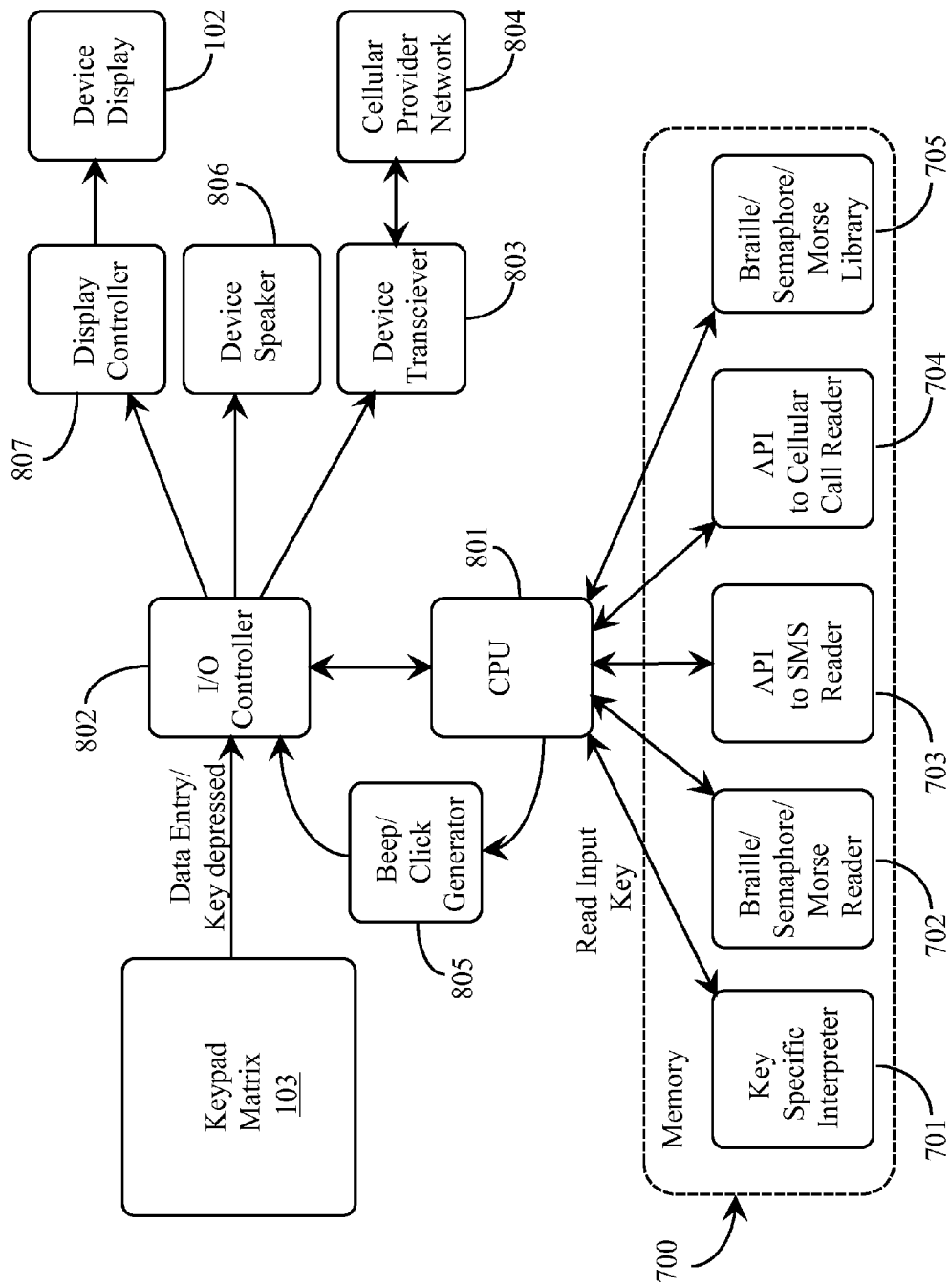
FIG. 8 is a process flow diagram for keypad keystrokes applied to device examples illustrated in FIGS. 2, 3, 4 and 6 according to various embodiments of the present invention.

Referring to FIG. 8, a process diagram for basic program operation is illustrated in one embodiment. The skilled artisan will appreciate that re-association of keystrokes to other than the standard, default input, may be done differently in many different sorts of electronic devices, and the way it will be done will be device-specific. But in every case it will be through software or firmware built into the device or added to the device.

The process starts in this example when a key is depressed on keypad matrix 103 by a user. The input signal passes to an onboard I/O controller 802, where the form of input received may be determined. Being determined to be keyboard input, the signal is passed to a central processing unit (CPU) 801. The signal is parsed in real time and is queried for a mode key input by key specific interpreter 701. If the input signal is keypad input, other than mode input, the key specific interpreter will pass control to the Braille/Semaphore/Morse reader. The input is parsed, dependent upon the user selected mode, and control is passed to the Braille/Semaphore/Morse code reader 702, the API to SMS reader 703 or the API to cellular call reader. It should be noted, if the input signal is determined to be keypad character input, a signal may be sent to a beep/click generator 805, pass through the I/O controller and on to an onboard device speaker 806 (not shown). This will provide a visually impaired or blind user with audible feedback as keystrokes are performed to the keypad.

The input signal, determined to be Braille input, is compared to character tables stored in the Braille/Semaphore/Morse library and translated into a human-readable code character. Then it is compiled or built in the API to SMS interface, awaiting a send response from the user. At this time a signal is sent to the I/O control bus where it will be transferred to a display controller 807 and then pass to a device display 102.

It should be noted, the default mode of operation for cellular phone device 200, 300, or 400 previously described in this document will be its most basic use, namely to send and receive cellular calls. Therefore, the user must select a mode other than cellular phone mode in order to operate in alternative modes of the device. Thus, when operating in cellular mode, a signal received from the keypad in this mode is handled by the API to cellular mode. After compiling keypad input such as, a complete phone number for example, and a send input signal is received from the key specific interpreter, control is passed to the I/O controller. The I/O controller passes the output signal to the onboard device transceiver 803 and then on to a cellular provider network (CPN) 804.

Concerning computer keypad 600, the default mode will reflect a standard computer numerical keypad that is readily available in the market today. If any other mode of operation is desired from a user, the specific mode will need to be selected from specific keystroke inputs as noted previously in this disclosure.

It will be apparent to one with skill in the art that the software/firmware and keypad devices of the invention may be described as using some or all of the mentioned features and components without departing from the spirit and scope of the present invention. It will also be apparent to the skilled artisan that the embodiments described above are specific examples of a single broader invention which may have greater scope than any of the singular descriptions taught. There may be many alterations made in the descriptions without departing from the spirit and scope of the present invention.

The invention claimed is:

1. A communication device, comprising:
an input keypad having physical input keys arranged in a matrix of rows and columns, each displaying alphanumeric characters for text and phone communication;
a mode input mechanism enabled to select at least a first mode, second mode and a third mode from a plurality of available modes; and
software or firmware responsive to the first mode selected through the mode input mechanism, comprising a specific mapping wherein individual keys represent specific individual dots in a Braille matrix, the key positions matching the dot positions in a Braille cell, and one further key is mapped to provide signaling of a next character, selection of the second mode functions according to the alphanumeric characters, and selection of the third mode the software or firmware maps input keys and processes according to flag signals of a semaphore code;
wherein, in the first mode, a character is input by pressing, in any order, the keys on the keyboard that represent the dots in the Braille cell for that character, and then pressing the key mapped to provide signaling of a next character, in the third mode individual keys are each mapped to one of a left, right, up or down hand flag position in the semaphore code associated with a key position in the keypad, and two keys pressed in sequence are mapped to a single output character according to the semaphore code.

2. The communication device of claim 1 wherein the input keys representing dots in a Braille cell are dedicated as two columns of three keys each or 3 columns with three keys each for semaphore operation and the association to position correlates left flag positions to a leftmost column, right flag positions to a rightmost column and up and down flag positions to a column of keys in the center of the leftmost and rightmost columns.

3. The communication device of claim 2 wherein the two columns representing dots in the Braille cell and the are the leftmost and rightmost columns on the keypad.

4. The communication device of claim 1 wherein an additional mode maps pressing of two or more input keys in sequence to an eight-point Braille matrix and process.

5. The communication device of claim 4 wherein the input keys mapped as dots in a Braille cell are dedicated as two columns of four keys each.

6. The communication device of claim 5 wherein the two columns are leftmost and rightmost columns on the keypad.

7. A method for character input with a keypad, comprising the steps of:
(a) mapping individual keys on the keypad in a first mode to alphanumeric characters used for phone and text communication, each key only displaying alphanumeric characters for phone and text input;
(b) mapping individual keys on the keypad in a second mode to one each of a dot represented in a Braille cell, the key positions in the same positions as each of the dots in the cell, pressing, in any order, the keys on the keypad that represent the dots in the Braille cell for a character;
(c) mapping one further key on the keypad to provide signaling of a next character; and
(d) mapping individual keys on the keypad in a third mode according to flag signals of a semaphore code, where one of a left, right, up or down hand flag position in the semaphore code is associated each with a key position in the keypad, and two keys pressed in sequence are mapped to a single output character according to the semaphore code.

8. The method of claim 7 wherein the keys mapped as dots in a Braille cell are dedicated as two columns of three keys each, or 3 columns with three keys each for semaphore operation and the association to position correlates left flag positions to a leftmost column, right flag positions to a rightmost column and up and down flag positions to a column of keys in the center of the leftmost and rightmost columns.

9. The method of claim 8 wherein the two columns are leftmost and rightmost columns on the keypad.

10. The method of claim 7 wherein the keypad is integrated with a cellular telephone.

11. The method of claim 7 wherein the keys mapped as dots in a Braille cell are mapped to an eight-point Braille matrix, having eight keys in two columns of four keys each.

12. The method of claim 7 wherein comprising a fourth mode mapping pressing of two or more input keys in sequence to Morse code, one input key mapped to a short Morse signal and another input key mapped to a long Morse signal.

* * * * *